United States Patent
Foster et al.

(10) Patent No.: US 7,487,678 B2
(45) Date of Patent: Feb. 10, 2009

(54) Z OFFSET MEMS DEVICES AND METHODS

(75) Inventors: Michael J. Foster, Issaquah, WA (US);
Shifang Zhou, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/610,050

(22) Filed: Dec. 13, 2006

(65) Prior Publication Data

US 2008/0142913 A1     Jun. 19, 2008

(51) Int. Cl.
*H01L 21/02* (2006.01)
*H01L 21/479* (2006.01)

(52) U.S. Cl. ..................................... 73/432.1; 438/466

(58) Field of Classification Search ................ 73/432.1; 438/466, 469, 470
See application file for complete search history.

(56) References Cited

U.S. PATENT DOCUMENTS

| | | | |
|---|---|---|---|
| 5,666,258 A * | 9/1997 | Gevatter et al. | 361/207 |
| 2004/0036132 A1 * | 2/2004 | de los Santos | 257/414 |
| 2005/0002079 A1 * | 1/2005 | Novotny et al. | 359/245 |
| 2005/0074919 A1 * | 4/2005 | Patel et al. | 438/107 |
| 2005/0264452 A1 * | 12/2005 | Fujishima et al. | 343/700 MS |

* cited by examiner

*Primary Examiner*—Edward Lefkowitz
*Assistant Examiner*—Punam Patel
(74) *Attorney, Agent, or Firm*—Black Lowe & Graham PLLC

(57) ABSTRACT

A microelectromechanical system (MEMS) device with a mechanism layer and a base. The top surface of the base is bonded to the mechanism layer and defines a gap in the top surface of the base. A portion of the mechanism layer is deflected into the gap until it contacts the base, and is bonded to the base.

10 Claims, 4 Drawing Sheets

Z OFFSET MEMS DEVICES AND METHODS

BACKGROUND OF THE INVENTION

Standard microelectromechanical systems (MEMS) processing techniques create structures that are symmetric in the z axis (out of the wafer's surface) but can vary in the x and y axes (in the plane of the wafer's surface). Presently, creating asymmetry in the z-axis can be performed by deflecting with stiction plates or by selective thinning. Deflecting with stiction plates leads to devices which are sensitive to z motion, but is not easily implemented for multiple z-offsets in both the positive and negative z directions and also requires more steps and additional processing layers, thereby costing more money. Selective thinning is performed by thinning one set of teeth of a comb drive in the Z-direction, but this requires an extra mask and additional etches, and it is also rather inaccurate. One method of more easily creating asymmetry requires a top and a bottom cover enclosing the mechanism layer of the MEMS device to produce asymmetry in the negative and positive z directions. Some uses for MEMS devices require an exposed mechanism layer, and a top cover is incompatible with these uses.

Thus, there exists a need for methods to easily form z-offsets in MEMS devices without completely enclosing the MEMS device.

BRIEF SUMMARY OF THE INVENTION

A microelectromechanical system (MEMS) device with a mechanism layer having a first part and a second part, and a base for attaching the mechanism layer. The mechanism layer is bonded to the base, and then an electrically conductive or semi-conductive material is used to deflect one of the first and second parts in the negative z direction until it contacts the base. A voltage is then applied through the electrically conductive material to bond the part to the base, and the electrically conductive material is removed, thereby creating z axis asymmetry without the need for a top cover.

DETAILED DESCRIPTION OF THE PREFERRED EMBODIMENT

Figure 1A:
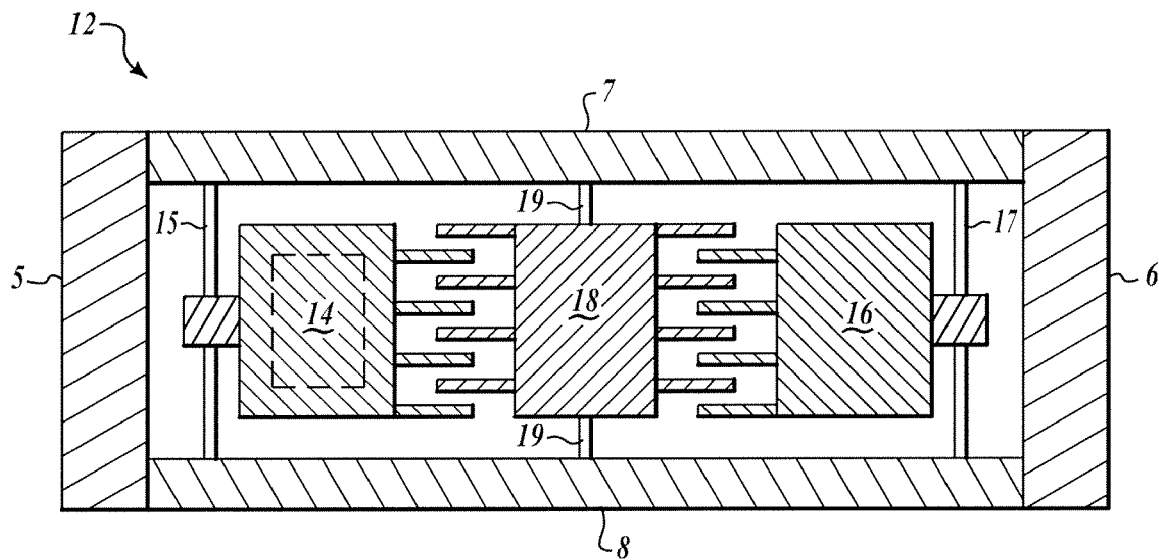
FIGS. 1A and 1B are top views of alternate embodiments of mechanism layers formed in accordance with the present invention.

FIG. 1A is a top view of an example mechanism layer 12 formed according to the present invention. The mechanism layer 12 includes walls 5, 6, 7, 8, a first movable portion 14, a second movable portion 16, and a fixed portion 18. The first movable portion 14 is attached to walls 7, 8 by flexure 15 (also torsional flexure or hinge), the second movable portion 16 is attached to walls 7, 8 by flexure 17, and the fixed portion 18 is attached to walls 7, 8 by flexures 19.

Figure 1B:
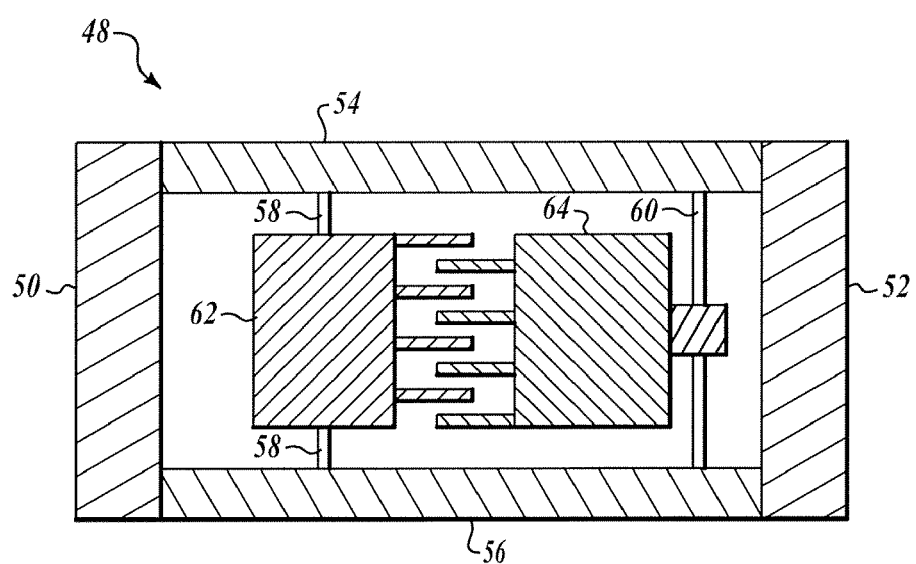

FIG. 1B is a top view of an alternate embodiment of a mechanism layer 48. The mechanism layer 48 includes walls 50, 52, 54, 56, a movable portion 64 attached to walls 54, 56 by flexure 60, and a fixed portion 62 attached to walls 54, 56 by flexures 58.

Figure 2A:
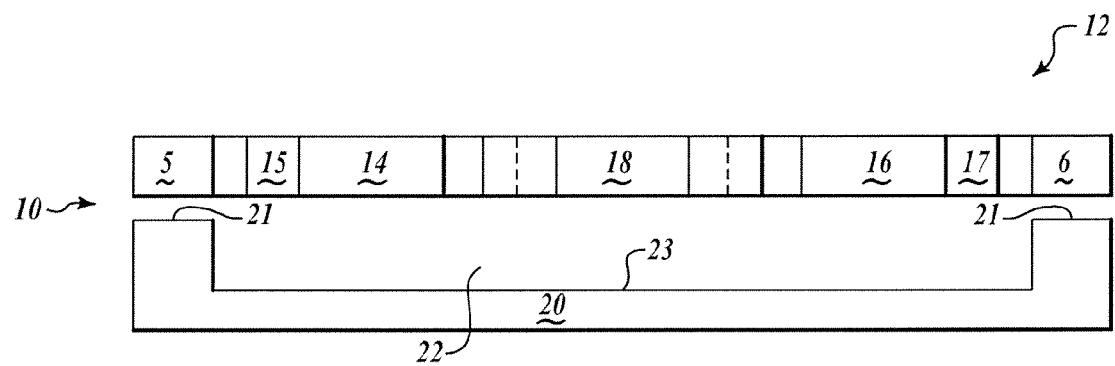
FIGS. 2A, 2B, and 2C illustrate various intermediate structures produced by a method according to the present invention.
Figure 2B:
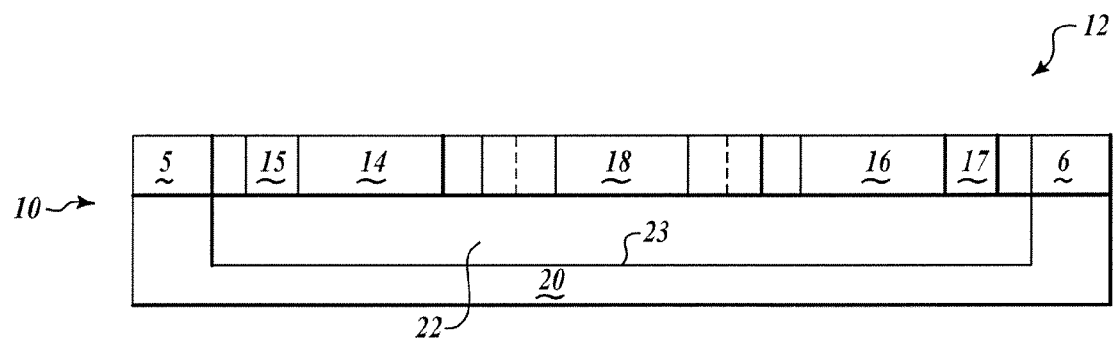
Figure 2C:
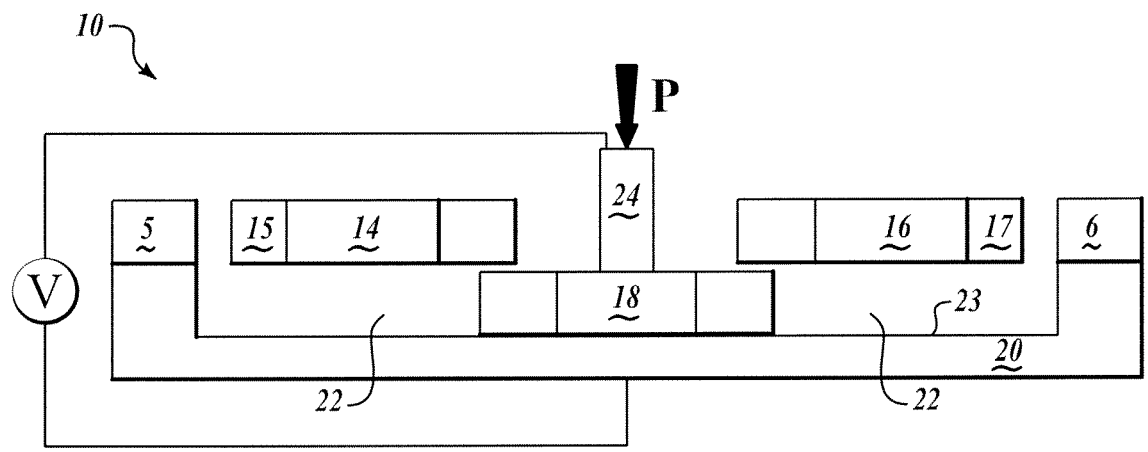

FIGS. 2A, 2B, and 2C illustrate side views of various intermediate structures of a microelectromechanical system (MEMS) device 10 formed in accordance with one embodiment of the invention. FIG. 2A shows the mechanism layer 12 of FIG. 1A. The mechanism layer 12 is made of silicon. A base 20 with a top surface 21, a gap 22, and a gap surface 23 is also shown. The base 20 is made of glass. The depth of the gap 22 equals the desired z-offset distance of the fixed portion 18. The gap 22 is formed by wet etching or other processes known to those have ordinary skill in the art.

FIG. 2B shows the mechanism layer 12 and the base 20 after bonding the mechanism layer 12 to the top surface 21. In the case of a silicon mechanism layer 12 and a glass base 20, anodic bonding may be used to bond the mechanism layer 12 to the top surface 21. When the base 20 and mechanism layer 12 are made of different materials, appropriate bonding techniques known to those having ordinary skill in the art may be used. After bonding, flexures 15 and 17 allow movement of the movable portions 14, 16.

Figure 3:
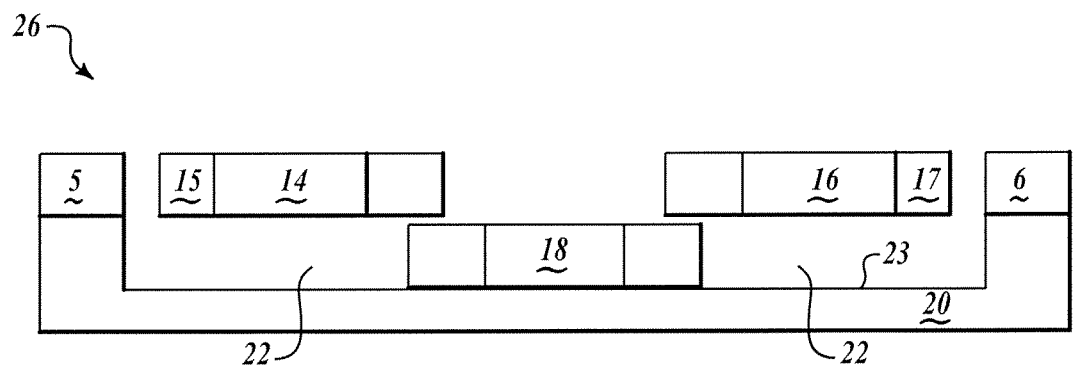
FIG. 3 is a side view of a MEMS device according to the present invention.

FIG. 2C shows the base 20 with the fixed portion 18 of the mechanism layer 12 being displaced down into contact with the gap surface 23 by an electrically conductive or semi-conductive material 24, preferably highly doped silicon. The electrically conductive material 24 is sized and shaped such that it may be used to displace the fixed portion 18 but not the first and second movable portions 14, 16. While the electrically conductive material 24 is in contact with the fixed portion 18 and the fixed portion 18 is in contact with the gap surface 23, a voltage V and a pressure P are applied between the base 20 and the fixed portion 18 to effect bonding of the fixed portion 18 to the gap surface 23. After bonding, the electrically conductive material 24 is removed, leaving the finished structure 26 of FIG. 3 (note that walls 7, 8 are not shown for clarity).

Figure 4:
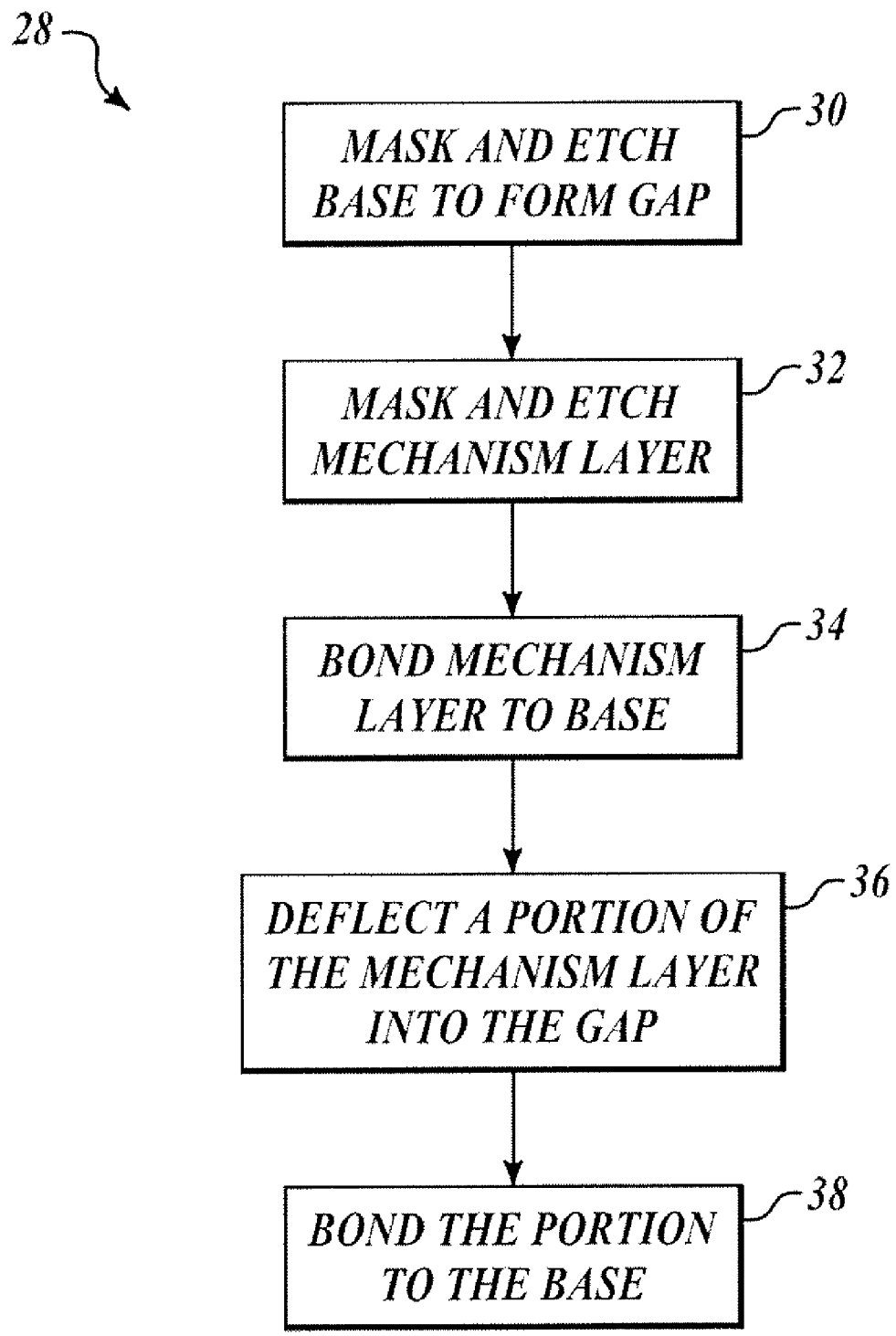
FIG. 4 is a block diagram of a method according to the present invention.

A block diagram 28 of an example method according to the present invention is shown in FIG. 4. At a first block 30, a base is masked and etched to form a gap. At a second block 32, a mechanism layer is masked and etched to form the various structures of the mechanism layer. At a block 34, the mechanism layer is bonded to the base. At a block 36, a portion of the mechanism layer is deflected into the gap of the base until it contacts a surface of the gap. At a block 38, the deflected portion is bonded to the base.

Note that the method of the present invention may be combined with the methods disclosed in co-pending and jointly owned U.S. patent application Ser. No. 11/360,870, filed on Feb. 23, 2006 and titled "Z OFFSET MEMS DEVICE," herein incorporated by reference, to enable offsets in the positive and negative z directions without including a top cover. Offsets in the negative z direction can be produced by the methods of the present invention, and offsets in the positive z direction can be produced by the methods of the "Z OFFSET MEMS DEVICE" application.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A microelectromechanical (MEMS) device comprising:
 a mechanism layer comprising:
  a first part; and
  a second part;
 a highly doped silicon in contact with the first part; and
 a base bonded to the mechanism layer, the base comprising:
  a top surface bonded to the mechanism layer, the top surface defining a gap equal to a desired offset distance and a gap surface,
 wherein the first part is operable to be deflected by the highly doped silicon into the gap until the first part contacts the base and bonded to the gap surface in response to the deflection.

2. The device of claim 1, wherein the first part and the second part include a comb structure.

3. The device of claim 1, wherein the base includes glass.

4. The device of claim 1, wherein the mechanism layer includes silicon.

5. The device of claim 1, wherein the one of the first part and the second part is anodically bonded to the gap surface.

6. A method comprising:
 bonding a mechanism layer to a base;
 deflecting with highly doped silicon a portion of the mechanism layer into a gap in the base until the portion contacts the base; and
 bonding the portion to the base.

7. The method of claim 6, wherein bonding a mechanism layer to a base includes anodically bonding the mechanism layer to the base.

8. The method of claim 6, wherein bonding the portion to the base includes anodically bonding the portion to the base.

9. The method of claim 6, further including forming a gap in the base by wet etching.

10. A microelectromechanical (MEMS) device comprising:
 a mechanism layer comprising:
  a plurality of walls;
  at least one moveable first part flexibly coupled to the walls via a flexure that is configured to permit movement of the moveable first part; and
  a fixed second part displaced downward from the moveable first part by a z-offset value;
 an electrically conductive highly doped silicon material in contact with the second part and operable to deflect the second part; and
 a base comprising:
  a top surface bonded to a bottom surface of the walls of the mechanism layer; and
  a gap surface, the gap surface located downward from the top surface by a gap distance, wherein the gap distance corresponds to the z-offset value,
 wherein the fixed second part is fixed to the gap surface of the base, and
 wherein the fixed second part is bonded to the gap surface of the base in response to the fixed second part being deflected onto the gap surface by a force applied to the fixed second part by the electrically conductive highly doped silicon material and bonded to the gap surface by a voltage applied across the fixed second part and the gap surface by the electrically conductive highly doped silicon material.

* * * * *